US012648374B2

(12) United States Patent
Oba et al.

(10) Patent No.: US 12,648,374 B2
(45) Date of Patent: Jun. 2, 2026

(54) METHOD FOR FORMING INSULATING FILM, AND SUBSTRATE PROCESSING SYSTEM

(71) Applicant: Tokyo Electron Limited, Tokyo (JP)

(72) Inventors: Daisuke Oba, Nirasaki City (JP);
Nobuo Matsuki, Nirasaki City (JP);
Yoshinori Morisada, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/841,870

(22) PCT Filed: Feb. 20, 2023

(86) PCT No.: PCT/JP2023/005939
§ 371 (c)(1),
(2) Date: Aug. 27, 2024

(87) PCT Pub. No.: WO2023/167031
PCT Pub. Date: Sep. 7, 2023

(65) Prior Publication Data
US 2025/0166990 A1 May 22, 2025

(30) Foreign Application Priority Data
Mar. 4, 2022 (JP) ................................. 2022-033322

(51) Int. Cl.
H10P 14/60 (2026.01)
C23C 16/52 (2006.01)
C23C 16/56 (2006.01)

(52) U.S. Cl.
CPC .......... H10P 14/6532 (2026.01); C23C 16/52 (2013.01); C23C 16/56 (2013.01);
(Continued)

(58) Field of Classification Search
CPC ........... H01L 21/0234; H01L 21/02214; H01L 21/02219; H01L 21/02274; H01L 21/0217;
(Continued)

(56) References Cited

U.S. PATENT DOCUMENTS

2014/0158580 A1* 6/2014 Xiao ...................... C07F 7/1804
556/412
2016/0244879 A1* 8/2016 Liang .................... C23C 16/505
(Continued)

FOREIGN PATENT DOCUMENTS

JP 07235535 A * 9/1995
JP H07-235535 A 9/1995
(Continued)

OTHER PUBLICATIONS

Machine translation, JP 07-235535 (Year: 1995).*

*Primary Examiner* — Michael G Miller
(74) *Attorney, Agent, or Firm* — Armstrong Teasdale LLP

(57) ABSTRACT

A method of forming an insulating film includes supplying a precursor gas to a substrate to generate a fluidic oligomer by plasma polymerization and deposit the fluidic oligomer on the substrate, performing a plasma process on the substrate after the depositing the fluidic oligomer, so that at least a part of the fluidic oligomer is hydrogen-terminated while maintaining fluidity of the fluidic oligomer, and subsequently performing an annealing process, which includes a plasma process, on the substrate to form the insulating film.

26 Claims, 5 Drawing Sheets

(52) U.S. Cl.
  CPC ...... *H10P 14/6336* (2026.01); *H10P 14/6684*
           (2026.01); *H10P 14/6687* (2026.01)

(58) Field of Classification Search
  CPC .............. H01L 21/31; H01L 21/02112; H01L
           21/02205; H01L 21/67213; C23C 16/52;
           C23C 16/56; C23C 16/045; C23C 16/30;
                    C23C 16/345; C23C 16/50
  See application file for complete search history.

(56)                  References Cited

U.S. PATENT DOCUMENTS

2018/0025907 A1*   1/2018  Kalutarage ....... H01L 21/02167
                                                   438/786
2019/0165175 A1*   5/2019  More ................... H10D 30/608

FOREIGN PATENT DOCUMENTS

| | | | |
|---|---|---|---|
| JP | 2014-132653 A | 7/2014 | |
| JP | 2018-512727 A | 5/2018 | |
| WO | WO-2019142055 A2 * | 7/2019 | ....... H01L 21/02167 |
| WO | 2021010004 A1 | 1/2021 | |

* cited by examiner

METHOD FOR FORMING INSULATING FILM, AND SUBSTRATE PROCESSING SYSTEM

CROSS-REFERENCE TO RELATED APPLICATIONS

The present application is a U.S. National Stage Entry of International Patent Application No. PCT/JP2023/005939, filed Feb. 20, 2023, which claims the benefit of priority to Japanese Patent Application No. 2022-033322, filed Mar. 4, 2022, each of which is hereby incorporated herein by reference in its entirety.

TECHNICAL FIELD

The present disclosure relates to a method of forming an insulating film and a substrate processing system.

BACKGROUND

In a manufacturing process of semiconductor devices, there exists a process of embedding an insulating film containing silicon into a fine three-dimensional structure on a substrate. Conventionally, coating techniques have been used for embedding such an insulating film containing silicon. However, as a technique capable of obtaining better film quality, a fluidic CVD, in which a film is formed by increasing a molecular weight of a raw material gas in a chamber to give the raw material gas liquid-like fluidity, has been proposed. As a technique using the fluidic CVD, Patent Document 1 describes a technique in which an oxygen-containing silicon compound gas and a non-oxidizing hydrogen-containing gas are reacted under presence of plasma to form a fluidic silanol compound on a substrate and the substrate is then annealed to form an insulating film.

PRIOR ART DOCUMENT

Patent Document

Patent Document 1: International Publication No. 2021/010004

SUMMARY

The present disclosure provides a method of forming an insulating film and a substrate processing system, which are capable of forming a high-quality insulating film in a fine recess of a substrate by using fluidic CVD.

A method of forming an insulating film according to an aspect of the present disclosure includes: supplying a precursor gas to a substrate to generate a fluidic oligomer by plasma polymerization and deposit the fluidic oligomer on the substrate; performing a plasma process on the substrate after the depositing the fluidic oligomer, so that at least a part of the fluidic oligomer is hydrogen-terminated while maintaining fluidity of the fluidic oligomer; and subsequently performing an annealing process, which includes a plasma process, on the substrate to form the insulating film.

According to the present disclosure, it is possible to provide a method of forming an insulating film and a substrate processing system, which are capable of forming a high-quality insulating film in a fine recess of a substrate by using fluidic CVD.

BRIEF DESCRIPTION OF DRAWINGS

FIG. 3 is a diagram illustrating a typical and specific example of the method of forming the insulating film according to the embodiment.

FIG. 4 is a schematic configuration view schematically illustrating an example of a substrate processing system which performs the method of forming the insulating film.

DETAILED DESCRIPTION

Hereinafter, embodiments will be described in detail with reference to the accompanying drawings.

Circumstances

First, circumstances will be described.

When an insulating film is embedded into a fine three-dimensional structure on a substrate, in fluidic CVD, a fluidic intermediate is generated in a chamber to embed the insulating film into the fine three-dimensional structure. Thus, a higher quality film is obtained compared to coating techniques.

However, when the technique disclosed in Patent Document 1, for example, is used as a fluidic CVD technique, a fluidic silanol compound (typically fluidic oligomer) is deposited on the substrate by a plasma process (plasma polymerization), and the substrate is then annealed to form an insulating film. Therefore, it is difficult to achieve both embedding property and film quality simultaneously. That is, high fluidity of the fluidic oligomer may be used in consideration of embedding property, and for this, it is advantageous that the fluidic oligomer has a molecular structure with alkyl group termination. However, in case of the molecular structure described above, an a film density decreases due to increase in residual carbon and voids and cracks are generated due to increase in post-annealing shrinkage, resulting in deterioration in film quality. Conversely, when reducing the alkyl group termination of the fluidic oligomer in order to maintain good film quality, embedding property deteriorates due to decrease in fluidity, which may also lead to generation of voids.

As a result of review to solve the issues described above, a method was devised, in which after a precursor gas is supplied to a substrate to generate a fluidic oligomer by plasma polymerization, a plasma process is performed to hydrogen-terminate at least a part of the fluidic oligomer while maintaining fluidity thereof and an annealing process including a plasma process is then performed on the substrate to form an insulating film.

By the method described above, even when a fluidic oligomer having a high-fluidity structure including alkyl group termination is embedded, after the embedding, the fluidic oligomer is modified to be hydrogen-terminated while maintaining fluidity thereof. Thus, it is possible to reduce residual carbon and shrinkage when the fluidic oligomer is solidified by final annealing. Therefore, since generation of voids or cracks and decrease in film density are prevented, it is possible to form a high-quality insulating film in a fine recess of the substrate.

Specific Embodiments Next, specific embodiments will be described.

Method of Forming Insulating Film

Figure 1:
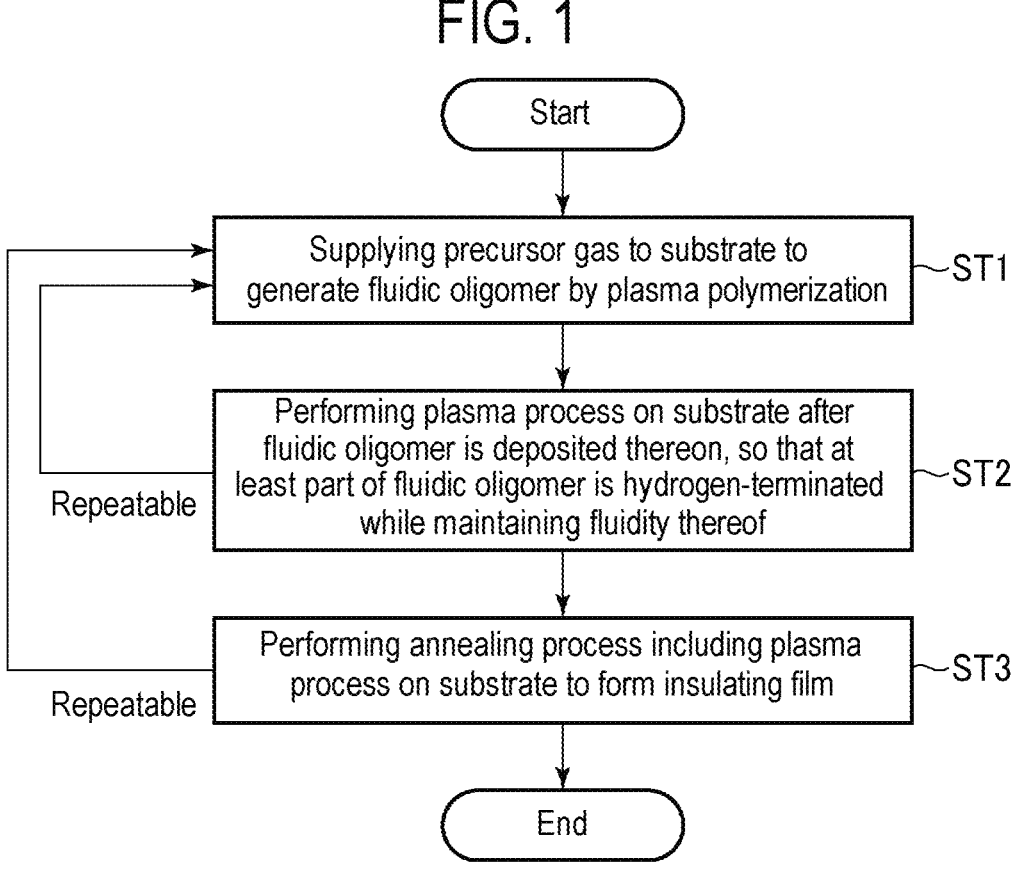
FIG. 1 is a flowchart illustrating a method of forming an insulating film according to an embodiment.

FIG. 1 is a flowchart illustrating a method of forming an insulating film according to an embodiment.

A method of forming an insulating film according to the present embodiment includes the following steps ST1, ST2, and ST3. In step ST1, a precursor gas is supplied to a substrate to generate a fluidic oligomer by plasma polymerization. In step ST2, a plasma process is performed on the substrate after the fluidic oligomer is deposited thereon, so that at least a part of the fluidic oligomer is hydrogen-terminated while maintaining fluidity thereof. In step ST3, after the hydrogen termination plasma process in step ST2, an annealing process including a plasma process is performed on the substrate to form an insulating film.

Hereinafter, the method will be described in detail.

In step ST1, the substrate is not particularly limited, but a semiconductor substrate (semiconductor wafer) such as a silicon substrate is exemplified. As the substrate, a substrate having a fine three-dimensional structure on a surface thereof may be used. The fine three-dimensional structure includes fine recesses such as trenches or holes.

In step ST1, a silicon (Si)-containing precursor or boron (B)-containing precursor may be used as a precursor constituting the precursor gas. The Si-containing precursor may be a Si—O bond-containing precursor or a Si—N bond-containing precursor.

Examples of the Si—O bond-containing precursor may include alkoxysilane-based compounds (alkoxysilane-based monomers). As the alkoxysilane-based compounds, compounds represented by $(R1)_aSi(—O—R2)_{4-a}$ (where, R1 is any of —CH$_3$, —C$_2$H$_5$, —C$_3$H$_7$, —C$_2$H$_3$, and —C$_2$H, R2 is —CH$_3$ or —C$_2$H$_5$, and a is 0, 1, 2, or 3) may be used. Specifically, tetramethoxysilane (TMOS; Si(OCH$_3$)$_4$), methyltrimethoxysilane (MTMOS; Si(OCH$_3$)$_3$CH$_3$), tetraethoxysilane (TEOS; Si(OC$_2$H$_5$)$_4$), dimethyldimethoxysilane (DMDMOS; Si(OCH$_3$)$_2$(CH$_3$)$_2$), triethoxysilane (SiH (OC$_2$H$_5$)$_3$), trimethoxysilane (SiH(OCH$_3$)$_3$), and trimethoxy·disiloxane (Si(OCH$_3$)$_3$OSi(OCH$_3$)$_3$) may be used. These compounds may be used alone or in combination of two or more thereof.

As the Si—N bond-containing precursor, bis(tert-butylamino)silane (BTBAS), bis(tert-butylamino)methylsilane (BTBAS-MS), bis(ethylmethylamino)silane (BEMAS), tridimethylaminesilane (3DMAS), methyltridimethylaminosilane (3DMAMS), and hexamethylcyclotrisilazane (HMCT Silazane) may be used. These compounds may be used alone or in combination of two or more thereof.

As the B-containing precursor, diborane (B$_2$H$_6$), borazine, triethylborane (TEB), triethylamineborane (BTEA), tri(dimethylamino)borane (TDMAB), tri(ethylmethylamino)borane (TEMAB), and trimethylborazine (TMB) may be used. These compounds may be used alone or in combination of two or more thereof.

In step ST1, a fluidic oligomer is generated by plasma polymerization using the precursor gas as described above, and fluidic CVD is performed. Plasma polymerization may be performed by adding a non-oxidizing hydrogen-containing gas to the above-described precursor gas to generate plasma. Examples of the non-oxidizing hydrogen-containing gas may include H$_2$ gas, NH$_3$ gas, and SiH$_4$ gas, and these gases may be used alone or in combination of two or more thereof.

As the plasma during the plasma polymerization, plasma that contains an inert gas such as He, Ne, Ar, Kr, or N$_2$, or a plasma that contains an inert gas and hydrogen such as Ar/H$_2$ plasma may be used. Further, a plasma generation method is not particularly limited, and various methods such as capacitively coupled plasma (CCP), inductively coupled plasma (ICP), and microwave plasma (MWP) may be used. Among these, CCP may be used in some embodiments. Furthermore, the precursor may or may not be plasmarized during the plasma polymerization. As a method without plasmarizing the precursor, remote plasma, in which a precursor is introduced into a chamber along with plasma containing a hydrogen-containing gas, may be used.

Figure 2:
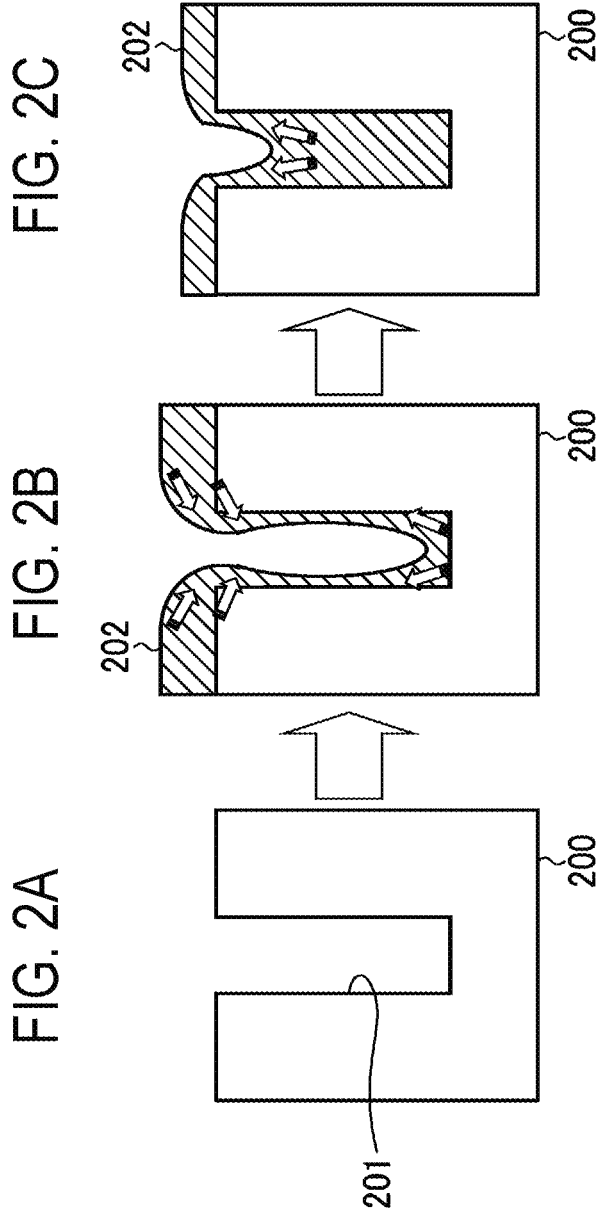
FIGS. 2A to 2C are schematic diagrams illustrating a process of depositing a fluidic oligomer on a substrate by plasma polymerization.

By a reaction between the precursor and the non-oxidizing hydrogen-containing gas as described above, some of alkyl groups or alkoxy groups of the precursor are detached and polymerized to generate a fluidic oligomer. Thus, the fluidic oligomer is deposited on the substrate. The deposition at this time is performed as illustrated in FIGS. 2A to 2C. That is, in a substrate 200 having a fine recess 201 formed on a surface thereof as illustrated in FIG. 2A, a fluidic oligomer 202 generated by plasma polymerization is introduced into the recess 201 due to surface tension, as illustrated in FIG. 2B. Then, the recess 201 is filled with the fluidic oligomer 202, as illustrated in FIG. 2C.

The term "oligomer" refers to a polymer (multimer) in which a relatively small number (up to a dozen molecules) of monomers are combined. In the present embodiment, examples of the fluidic oligomer include those containing, as a basic structure, any of SiOH, SiNH, SiCOH, SiCNH, SiCH, BNH, BCNH, SiBCNH, and SiBNH.

In step ST1, the fluidic oligomer may have alkyl group termination from the viewpoint of enhancing fluidity to improve embedding property. For example, it is exemplified that multiple molecules containing the above-mentioned basic structure are combined and some of hydrogen termination are replaced with alkyl groups.

In addition, from the viewpoint of ensuring fluidity of the fluidic oligomer, a temperature of a substrate may be low during the plasma polymerization. In particular, by setting the temperature of the substrate to be 80 degrees C. or less, it is possible to ensure sufficient fluidity and improve embedding property. From the viewpoint of obtaining better fluidity, the temperature of the substrate may be 30 degrees or less, more specifically, 20 degrees C. or less. The fluidity of the fluidic oligomer can be ensured even when the temperature of the substrate is as low as about −50 degrees C.

As described above, by using the fluidic oligomer having alkyl group termination and setting the temperature of the substrate to be 80 degrees or less, more specifically, 30 degrees C. or less, it is possible to achieve excellent embedding property without forming a cavity even in a fine recess having an aspect ratio of 10 or more.

In step ST2, a plasma process is performed so that at least a part of the fluidic oligomer is hydrogen-terminated while maintaining fluidity thereof. That is, during the plasma process in step ST2, by a substitution reaction by ions and radicals in the plasma, a carbon-containing group such as an alkyl group present at a terminus of the fluidic oligomer generated in step ST1 is removed to modify the oligomer to be hydrogen-terminated. In addition, in the present embodiment, the hydrogen termination also include OH termination.

In the plasma process in step ST2, plasma of a hydrogen-containing gas may be used. By using the plasma of the hydrogen-containing gas, hydrogen termination of the fluidic oligomer can be facilitated. As the hydrogen-containing gas, $H_2$ gas and $NH_3$ gas, more specifically, $H_2$ gas, may be used. In the plasma process in step ST2, plasma of an inert gas such as He gas may also be used without using the hydrogen-containing gas. In this case, hydrogen termination may be achieved by using hydrogen in the fluidic oligomer.

A plasma generation method during the plasma process in step ST2 is not particularly limited, and various methods such as capacitively coupled plasma (CCP), inductively coupled plasma (ICP), and microwave plasma (MWP) may be used. Among the methods described above, capacitively coupled plasma (CCP) may be used in some embodiments. Further, radio-frequency power for plasma generation may have a frequency of 60 MHz or less (for example, 13.56 Hz). By setting the frequency to be 60 MHz or less, it is possible to implant ions (hydrogen ions) more deeply and more efficiently to modify an entire film. When the frequency exceeds 60 MHz, it is likely that only a surface of the film is modified.

In order that the fluidic oligomer is hydrogen-terminated while maintaining fluidity thereof, the temperature of the substrate may be low during the plasma process, and similar to the plasma polymerization in step ST1, the hydrogen termination may be performed at 80 degrees C. or less. Specifically, the temperature may be 30 degrees C. or less, and more specifically, 20 degrees C. or less.

Examples of a film, in which the alkyl groups of the fluidic oligomer are removed and the fluidic oligomer is hydrogen-terminated by the plasma process in Step ST2, include those containing, as a basic structure, any of SiOH, SiNH, SiCOH, SiCNH, SiCH, BNH, BCNH, SiBCNH, and SiBNH, similar to those described in step ST1 above.

In step ST3, the film after being hydrogen-terminated in step ST2 is condensed and solidified by an annealing process, which includes a plasma process, to form a dense and stable insulating film. At this time, in order to efficiently and reliably solidify the film, a temperature may be set to a high temperature exceeding 80 degrees C., and more specifically, 150 degrees C. or more.

The annealing process at this time may be performed in a non-oxidizing atmosphere from the viewpoint of eliminating influence of oxidation on a base, and may be performed in an inert gas atmosphere such as $N_2$ gas or a noble gas (for example, Ar gas or He gas). The annealing process may include a plasma process, in order to efficiently condense and solidify the film. The annealing process may include solely a plasma process, or a combination of thermal annealing and plasma annealing. While the plasma process may use an inert gas only, it may use plasma containing a hydrogen-containing gas such as $H_2$ gas.

In addition, the plasma process during the annealing process may be performed using a frequency ranging from the VHF band (30 MHz to 300 MHz) to the microwave (MW) band (300 MHz to 3 THz). More specifically, the frequency may be 60 MHz or more. In typical ICP or CCP that is performed using a frequency of less than 30 MHz, it is likely that film damage occurs due to ions of high-energy exceeding 30 eV. However, the film damage can be suppressed by using a frequency ranging from the VHF to the MW band, particularly, 60 MHz or more. That is, when the frequency ranges from the VHF band to the MW band, particularly, 60 MHz or more, it is possible to irradiate ions and radicals with low-energy of 30 eV or less. Thus, since energy irradiated to the film is low, it is possible to suppress the film damage. Further, it is also possible to suppress oxidation of elements. More specifically, among the frequencies of 60 MHz or more, a frequency of 60 MHz or more and 300 MHz or less, which is within the VHF band, may be used.

The insulating film formed by the annealing process in step ST3 is a Si-containing film or B-containing film when a Si-containing precursor or B-containing precursor is used as a precursor. When the fluidic oligomer has, as a basic structure, any of SiOH, SiNH, SiCOH, SiCNH, SiCH, BNH, BCNH, SiBCNH, and SiBNH as described above, the insulating film is $SiO_2$, SiN, SiCO, SiCN, SiC, BN, BCN, SiBCN, or SiBN, which is formed by condensation and solidification of the fluidic oligomer.

When the formed insulating film is a carbon-containing film, for example, SiCO, SiCN, SiC, or SiBCN as described above, in the annealing process including plasma annealing in step ST3, a carbon-containing gas may be used as a gas supplied during the plasma annealing, in order to replenish carbon desorbed by the plasma annealing and prevent a carbon concentration in the film from being decreased. As the carbon-containing gas, a gas containing both carbon and hydrogen such as $C_mH_n$ (where m is an integer of 1 or more and n is an integer of 2 or more) may be used. Plasma that contains the gas containing carbon and hydrogen is more appropriate, because the desorbed carbon can be replenished by the carbon contained in the gas and the effects of hydrogen as described above can be achieved.

Both generating the fluidic oligomer in step ST1 and the plasma process in step ST2 may be performed at a low temperature of 80 degrees C. or less as described above, and may be performed in the same processing space. Further, the plasma annealing in step ST3 may be performed at a high temperature exceeding 80 degrees C., more specifically, at 150 degrees C. or more, as described above. Thus, step ST3 may be performed in a different processing space from that for steps ST1 and ST2, which may be performed at a low temperature.

Steps ST1 and ST2 may be repeated a plurality of times until a desired film thickness is achieved. Further, steps ST1 to ST3 may be repeated a plurality of times until a desired film thickness is achieved. Furthermore, the processes may end after repeating steps ST1 and ST2 a plurality of times and then performing step ST3, or step ST3 may be repeated a plurality of times after repeating steps ST1 and ST2 a plurality of times.

In the method of forming an insulating film according to the present embodiment, after a fluidic oligomer with high fluidity is deposited, a plasma process is performed so that at least a part of the fluidic oligomer is hydrogen-terminated while maintaining fluidity thereof. Thus, it is possible to remove alkyl groups and the like without generating voids or cracks in the film before the film is solidified. Further, since only hydrogen termination is removed when the film is solidified by the final annealing process, an amount of residual carbon becomes small and it is possible to reduce shrinkage during the solidification. Therefore, since generation of voids or cracks and a decrease in film density can be suppressed, it is possible to form a high-quality insulating film in fine recesses of a substrate.

Figure 3:
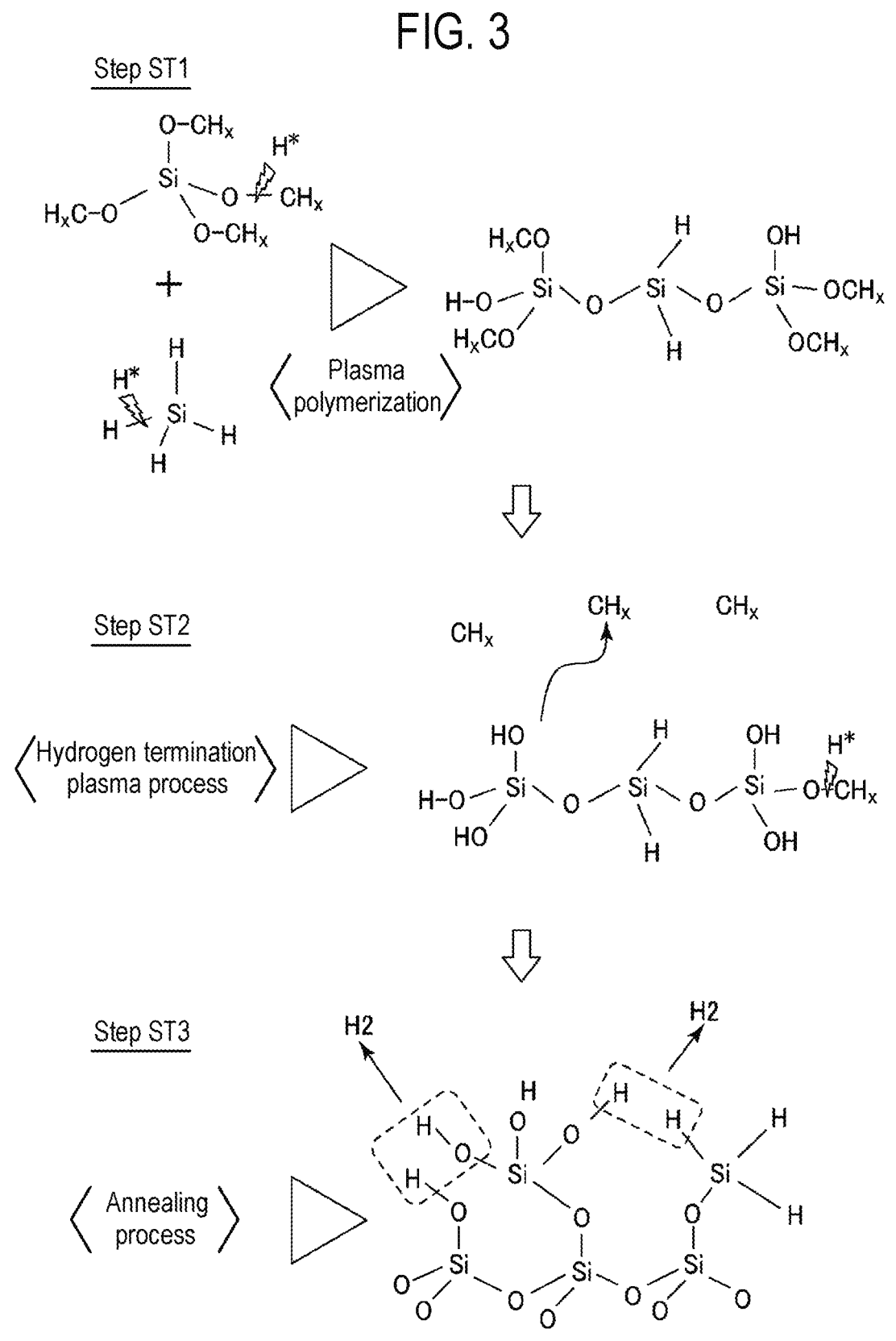

Next, a typical specific example of the present embodiment will be described with reference to FIG. 3. Here, first, the plasma polymerization in step ST1 is performed at a low temperature of 80 degrees C. or less, by using an alkoxysilane-based compound as the precursor gas and using silane gas (SiH$_4$ gas) as the non-oxidizing hydrogen-containing gas. Thus, a polysilanol oligomer as the fluidic oligomer is generated and deposited.

Subsequently, the hydrogen termination plasma process in step ST2 is performed. In step ST2, a plasma process using H$_2$ gas as the hydrogen-containing gas is performed at a low temperature of 80 degrees C. or less. Thus, while maintaining fluidity of the polysilanol oligomer, alkyl groups are removed by a substitution reaction by hydrogen ions and radicals, and the polysilanol oligomer is hydrogen-terminated.

Subsequently, the annealing process in step ST3 is performed. The annealing process in step ST3 includes a plasma process, which is performed at a high temperature exceeding 80 degrees C., more specifically, at 150 degrees C. or more, by plasma of an inert gas or plasma of a hydrogen-containing gas using a radio frequency ranging from the VHF band to the MW band. Thus, the film after the hydrogen-termination is condensed and solidified (dehydrogenation), and a SiO$_2$ film having a network structure, which is a stable insulating film, is formed.

Substrate Processing System

Next, a substrate processing system that performs the above-described method of forming an insulating film will be described.

Figure 4:
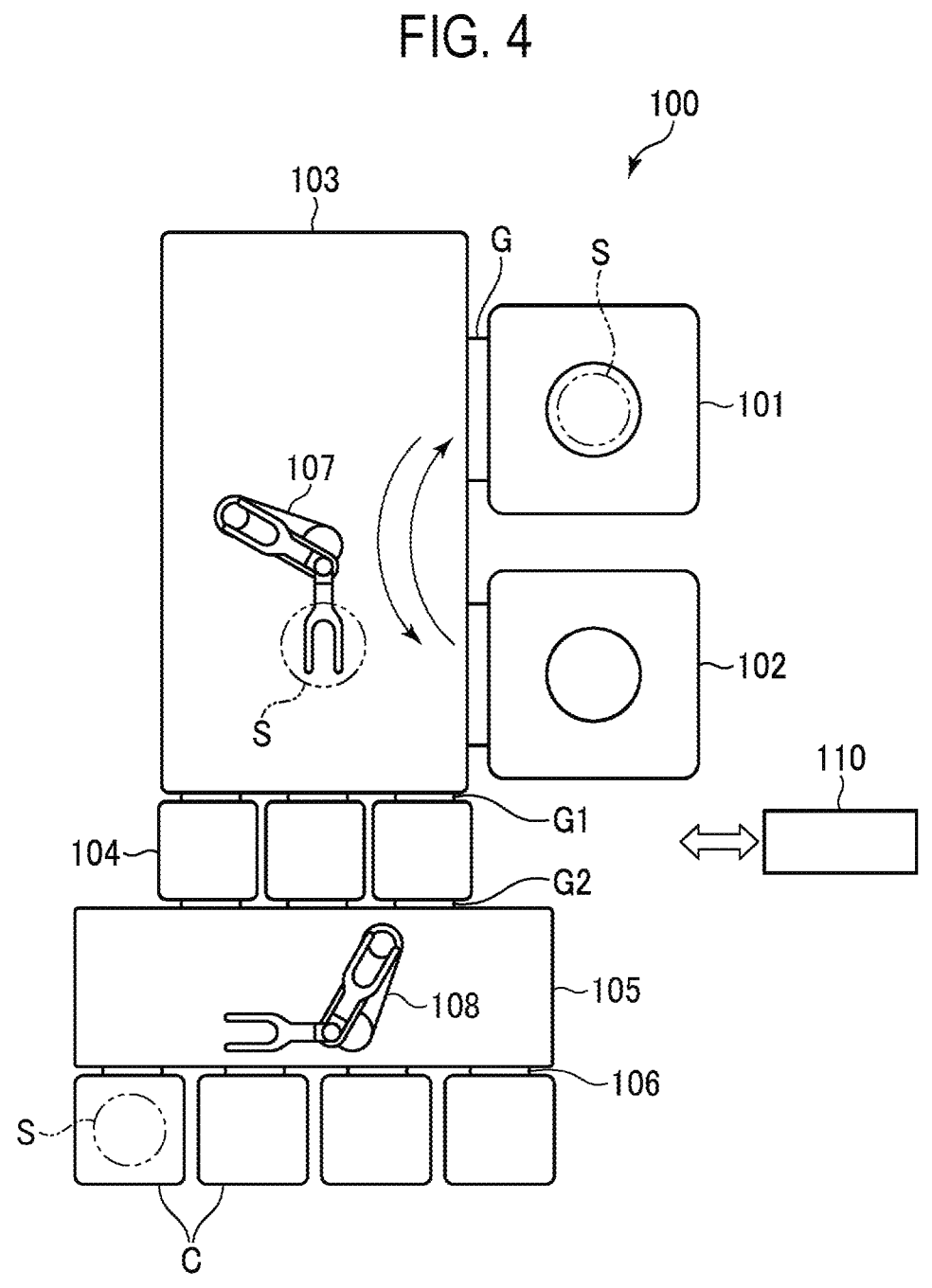

FIG. 4 is a schematic configuration view schematically illustrating an example of a substrate processing system.

As illustrated in FIG. 4, a substrate processing system 100 forms an insulating film on a substrate S, and includes a first processing apparatus 101 and a second processing apparatus 102. These processing apparatuses are connected to a wall of a vacuum transfer chamber 103 via gate valves G. An interior of the vacuum transfer chamber 103 is evacuated by a vacuum pump and is maintained at a predetermined degree of vacuum.

The first processing apparatus 101 performs the fluidic oligomer generation and deposition process in step ST1 and the hydrogen termination plasma process in step ST2 as described above. Further, the second processing apparatus 102 performs the annealing process in step ST3 as described above.

In addition, three load lock chambers 104 are connected to another wall of the vacuum transfer chamber 103 via gate valves G1. An atmospheric transfer chamber 105 is provided at an opposite side of the vacuum transfer chamber 103 with the load lock chambers 104 interposed therebetween. The three load lock chambers 104 are connected to the atmospheric transfer chamber 105 via gate valves G2. The load lock chambers 104 performs a pressure control between atmospheric pressure and vacuum when transferring the substrate S between the atmospheric transfer chamber 105 and the vacuum transfer chamber 103.

A wall of the atmospheric transfer chamber 105, opposite to a wall where the load lock chambers 104 are attached, is provided with four carrier attachment ports 106 for attaching carriers (such as FOUPs) C that accommodate the substrate S.

A first transfer mechanism 107 is provided in the vacuum transfer chamber 103. The first transfer mechanism 107 transfers the substrate S with respect to the first processing apparatus 101, the second processing apparatus 102, and the load lock chambers 104.

A second transfer mechanism 108 is provided in the atmospheric transfer chamber 105. The second transfer mechanism 108 transfers the substrate S with respect to the carriers C and the load lock chambers 104.

The substrate processing system 100 includes a controller 110. The controller 110 controls respective components of the first processing apparatus 101 and the second processing apparatus 102, an exhaust mechanism of the vacuum transfer chamber 103, an exhaust mechanism of the load lock chambers 104, the first transfer mechanism 107, the second transfer mechanism 108, and drive systems of the gate valves G, G1, and G2. The controller 110 includes a main controller having a CPU, an input device, an output device, a display device, and a storage device (storage medium). The main controller of the controller 110 controls processing of the substrate processing system 100 based on, for example, processing recipes, which are stored in the storage medium built in the storage device or set in the storage device.

Next, an operation of the substrate processing system 100 configured as described above will be described.

First, the substrate S is taken out from the carrier C by the second transfer mechanism 108 and is loaded into any of the load lock chambers 104. After that load lock chamber 104 is vacuum-evacuated, the substrate S is transferred from the load lock chamber 104 into the first processing apparatus 101 by the first transfer mechanism 107.

In the first processing apparatus 101, generating a fluidic oligomer by the plasma polymerization in step ST1 and depositing the fluidic oligomer on the substrate S are performed. In addition, subsequently, the hydrogen termination plasma process in step ST2 is performed. These processes are performed at a low temperature of 80 degrees C. or less, and are repeated a plurality of times as necessary.

After the processes in the first processing apparatus 101 is completed, the substrate S is taken out by the first transfer mechanism 107 and is transferred to the second processing apparatus 102. In the second processing apparatus 102, the annealing process including the plasma process in step ST3 is performed at a high temperature exceeding 80 degrees C., more specifically, at 150 degrees C. or more.

After the process in the second processing apparatus 102 is completed, if necessary, the substrate S is transferred back to the first processing apparatus 101 by the first transfer mechanism 107 to perform the processes in steps ST1 and ST2, and is further transferred to the second processing apparatus 102 to perform the process in step ST3.

After performing steps ST1 to ST3 a desired number of times, the substrate S is transferred to any of the load lock chambers 104 by the first transfer mechanism 107. Then, after the load lock chamber 104 is returned to atmospheric atmosphere, the substrate S is returned from that load lock chamber 104 to the carrier C by the second transfer mechanism 108.

The above-described processing is performed concurrently and in parallel for a plurality of substrates W, thereby completing formation of an insulating film on a predetermined sheets of substrates W.

Next, the first processing apparatus, which performs the generation and deposition of the fluidic oligomer in step ST1 and the hydrogen termination plasma process in step ST2, will be described.

Figure 5:
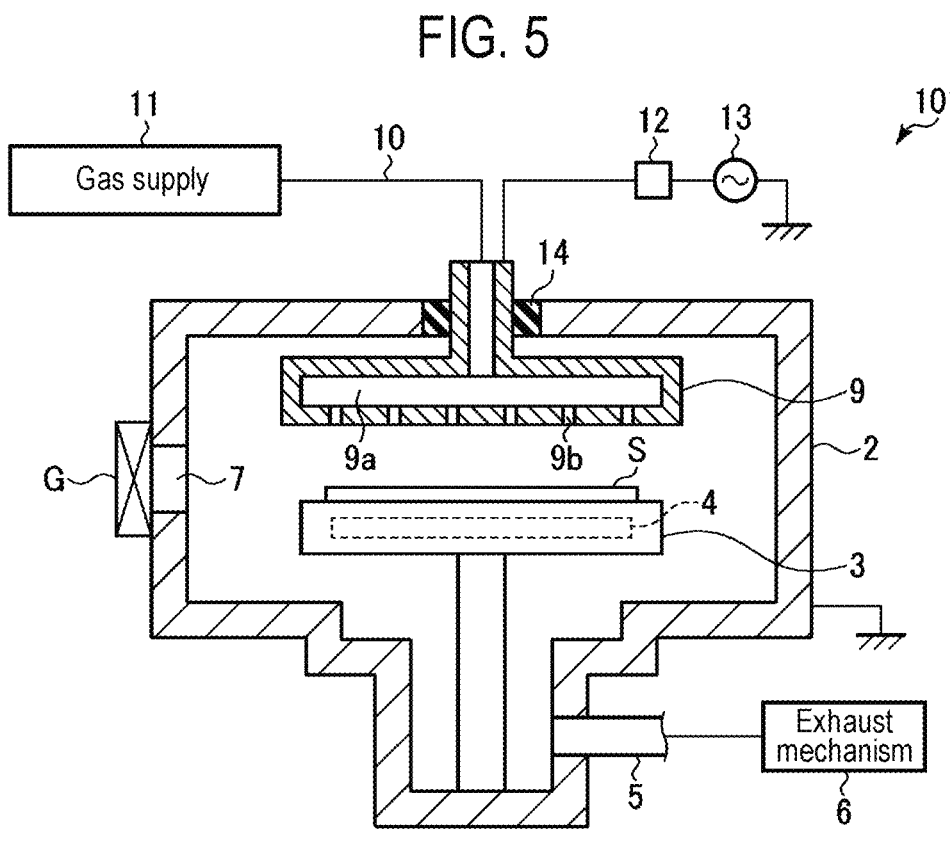
FIG. 5 is a cross-sectional view illustrating an example of a first processing apparatus, which generates and deposits a fluidic oligomer in step ST1 and performs a hydrogen termination plasma process in step ST2 in the substrate processing system of FIG. 4.

FIG. 5 is a cross-sectional view illustrating an example of the first processing apparatus. As illustrated in FIG. 5, the first processing apparatus 101 includes a chamber 2. The chamber 2 is grounded. A stage 3 for horizontally placing the substrate S thereon is provided in the chamber 2. The stage 3 is made of a metal, and a temperature regulator 4 configured to regulate a temperature of the substrate S is provided in the stage 3. The stage 3 is grounded via the chamber 2.

An exhaust pipe 5 is connected to a bottom of the chamber 2, and an exhaust mechanism 6 having a function of controlling an internal pressure of the chamber 2 is connected to the exhaust pipe 5. A transfer port 7 via which the substrate S is transferred is formed in a sidewall of the chamber 2, and the transfer port 7 is opened and closed by the gate valve G.

A gas shower head 9 is provided at an upper portion of the chamber 2 to face the stage 3. The gas shower head 9 has a gas chamber 9a therein and a plurality of gas discharge holes 9b at a bottom thereof. A space between the gas shower head 9 and a ceiling wall of the chamber 2 is insulated by an insulator 14.

A gas supply 11 is connected to the gas shower head 9 via a gas flow path 10. The gas supply 11 supplies a precursor gas, a non-oxidizing hydrogen-containing gas (for example, $SiH_4$ gas), $H_2$ gas, and inert gas, and the like. The inert gas is supplied as, for example, a carrier gas, a dilution gas, or a plasma generation gas. These gases reach the gas chamber 9a of the gas shower head 9 from the gas supply 11 via the gas flow path 10, and are discharged into the chamber 2 via the gas discharge holes 9b.

A radio-frequency power supply 13 is connected to the gas shower head 9 via a matcher 12. The radio-frequency power supply 13 applies radio-frequency power of, for example, 13.56 MHz to the gas shower head 9. By applying the radio-frequency power to the gas shower head 9, a radio-frequency electric field is formed between the gas shower head 9 and the stage 3, and a capacitively coupled plasma of the gas discharged from the gas shower head 9 is generated.

In the first processing apparatus 101 described above, the substrate S is placed on the stage 3, the temperature of the substrate S may be controlled by the temperature regulator 4 to be a temperature of 80 degrees C. or less, more specifically, 30 degrees C. or less, and the pressure is controlled to 13 Pa to 1,330 Pa. While the precursor gas and the non-oxidizing hydrogen-containing gas are supplied from the gas supply 11 into the chamber 2 via the gas shower head 9, the radio-frequency power is supplied from the radio-frequency power supply 13 to the gas shower head 9. Thus, a fluidic oligomer is generated by plasma polymerization, and is deposited on the substrate S. Then, the fluidic oligomer is embedded into a gap (recess) formed in the substrate S.

After the fluidic oligomer is deposited as described above, in a state in which the substrate S is placed on the stage 3, the temperature of the substrate S is maintained at the same low temperature as during the generation and deposition of the fluidic oligomer. Further, $H_2$ gas and an inert gas are supplied from the gas supply 11 into the chamber 2 via the gas shower head 9, and radio-frequency power is supplied to the gas shower head from the radio-frequency power supply 13. Thus, the plasma process is performed so that at least a part of the deposited fluidic oligomer is hydrogen-terminated while maintaining fluidity thereof.

As the second processing apparatus 102 for performing plasma annealing, an apparatus, which includes, for example, a chamber, a stage provided in the chamber, a heating mechanism for heating the substrate, a gas supply mechanism for supplying a gas into the chamber, an exhaust mechanism for exhausting an interior of the chamber, and a plasma generation mechanism for generating plasma with a radio frequency ranging from the VHF to the MW band, is exemplified. As the plasma generation mechanism, a mechanism that applies radio-frequency power of the VHF band to an electrode provided to face the stage, or a mechanism that radiates oscillated microwaves from a microwave oscillator via an antenna provided to face the stage.

When performing modification by plasma annealing, a greater modification effect can be expected as a temperature of a supplied gas increases. In order to increase the temperature of the gas supplied to the second processing apparatus 102, a temperature of the gas supply for the second processing apparatus 102 may be high, and more specifically, the temperature may exceed 80 degrees C. However, in case of microwave plasma, since a dielectric ceiling plate is necessarily required, there is a concern about damage to the ceiling plate, which makes it difficult to sufficiently increase the temperature. On the other hand, in case of VHF plasma, since a shower head made of a metal can be used as a gas supply, it is possible to set the temperature to exceed 80 degrees C. without any concern about the gas supply. For the reasons described above, the frequency in the plasma annealing may be in the VHF band, which allows using a shower head made of a metal, and particularly, the frequency may be the above-described frequency of 60 MHz or more, i.e., within a range from 60 MHz to 300 MHz.

In addition, in the substrate processing system 100, both the film forming process in step ST1 and the hydrogen termination plasma process in step ST2 are performed in the same processing space of the first processing apparatus 101, but step ST1 and step ST2 may be performed in separate apparatuses or separate processing spaces.

Experimental Example

Next, an experimental example will be described.

Here, first, as step ST1, a fluidic oligomer was generated and deposited on a substrate by plasma polymerization at 25 degrees C. by using tetraethoxysilane (TEOS) or tetramethoxysilane (TMOS) as a precursor gas and using $SiH_4$ as a non-oxidizing hydrogen-containing gas. Subsequently, as step ST2, a low-temperature $H_2$ plasma process was performed at the same 25 degrees C. while varying radio-frequency power. Thereafter, as step ST3, an annealing process, which includes thermal annealing at 550 degrees C. and subsequent plasma annealing, was performed to form a $SiO_2$ film.

A detailed condition at this time is as follows:

(1) Step ST1

Time: 200 seconds

Gas: TEOS or $TMOS/SiH_4/Ar/H_2=375/225/1800/2250$ sccm

Pressure: 4 Torr (532 Pa)

Plasma: 13.56 MHz, 50 W

Substrate Temperature: 25 degrees C.

(2) Step ST2

Time: 30 seconds

Gas: $Ar/H_2=6400/640$ sccm

Pressure: 1 Torr (133 Pa)

Plasma: 13.56 MHz, 0 to 450 W

Substrate Temperature: 25 degrees C.

(3) Step ST3

Thermal Annealing

Time: 300 seconds

Gas: Ar=11,000 sccm

Pressure: 4 Torr (532 Pa)

Substrate Temperature: 550 degrees C.

Plasma Annealing

Time: 30 seconds

Gas: $Ar/H_2=6400/640$ sccm

Plasma: 220 MHz, 450 W

Substrate Temperature: 550 degrees C.

Figure 6:
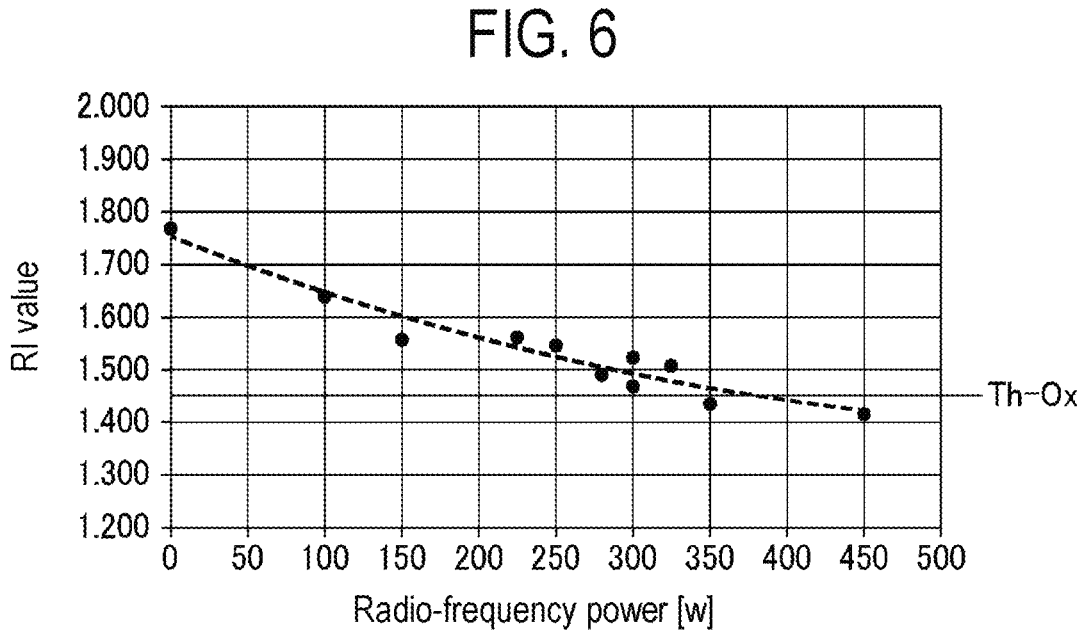
FIG. 6 is a diagram illustrating a relationship between radio-frequency power and an RI value in step ST2, which is obtained from an experimental example.

With respect to a sample in which an insulating film was formed while varying plasma power in step ST2 as described above, a refractive index (RI value) of the film was obtained. FIG. 6 illustrates a relationship between the radio-frequency power and the RI value in step ST2. As illustrated in FIG. 6, when the low-temperature $H_2$ plasma process in step ST2 was not performed (i.e., the radio-frequency power in step ST2 was 0 W), the RI value was about 1.77. On the other hand, when step ST2 was performed, it was confirmed that the RI value decreases as the radio-frequency power increases and becomes about 1.46 at 300 W or more, which is a typical RI value of $SiO_2$ films (thermal oxide films (Th-Ox)). This implies that carbon was removed from the film by the low temperature $H_2$ plasma process in step ST2. Further, the sample subjected to the low-temperature $H_2$ plasma process had fewer voids compared to a sample without being subjected to the low-temperature $H_2$ plasma process. From the results described above, it was confirmed that $SiO_2$ films having good quality are obtained by performing the low-temperature $H_2$ plasma process after the film formation by the plasma polymerization and before the annealing process.

Other Applications

Although the embodiments have been described above, the embodiments disclosed herein should be considered to be exemplary and not restrictive in all respects. The above embodiments may be omitted, replaced, or modified in various ways without departing from the scope and spirit of the appended claims.

For example, in the above embodiments, a case where a Si-containing film or a B-containing film is formed as an insulating film by using a Si-containing gas or a B-containing gas as a precursor gas have been described. However, the present disclosure is not limited thereto, and for example, the precursor and the insulating film may contain other metal elements such as aluminum. Further, the substrate processing system and the processing apparatus for performing film formation described in the above embodiments are merely examples. Furthermore, although semiconductor substrates (semiconductor wafers) such as silicon substrates have been exemplified as substrates, the present disclosure is not limited thereto and various other substrates may be used.

EXPLANATION OF REFERENCE NUMERALS

100: substrate processing system, 101: first processing apparatus, 102: second processing apparatus, 200: substrate, 201: recess, 202: fluidic oligomer

What is claimed is:

1. A method of forming an insulating film, comprising:
supplying a precursor gas to a substrate to generate a fluidic oligomer by plasma polymerization and depositing the fluidic oligomer on the substrate;
performing a plasma process on the substrate after the depositing the fluidic oligomer, so that at least a part of the fluidic oligomer is hydrogen-terminated while maintaining fluidity of the fluidic oligomer; and
subsequently performing an annealing process, which includes a plasma process, on the substrate to form the insulating film,
wherein the depositing the fluidic oligomer and the performing the plasma process to hydrogen-terminate the fluidic oligomer are performed while a temperature of the substrate is set to be 80 degrees C. or less.
2. The method of claim 1, wherein the performing the plasma process to hydrogen-terminate the fluidic oligomer uses plasma of a hydrogen-containing gas.

3. The method of claim 1, wherein plasma used in the performing the plasma process to hydrogen-terminate the fluidic oligomer is generated by using a radio frequency power of 60 MHz or less.
4. The method of claim 1, wherein the plasma polymerization is a plasma process performed by adding a non-oxidizing hydrogen-containing gas to the precursor gas.
5. The method of claim 1, wherein a precursor constituting the precursor gas has an alkyl group termination.
6. The method of claim 1, wherein the annealing process is performed while a temperature of the substrate is set to exceed 80 degrees C.
7. The method of claim 1, wherein the plasma process included in the annealing process is performed by using plasma of a gas containing hydrogen.
8. The method of claim 1, wherein the plasma process included in the annealing process is performed by using plasma of a gas containing carbon and hydrogen.
9. The method of claim 1, wherein the plasma process included in the annealing process is performed by using a frequency ranging from a VHF band to a microwave band.
10. The method of claim 9, wherein the plasma process included in the annealing process is performed by using a frequency of 60 MHz or more.
11. The method of claim 10, wherein a gas shower head configured to supply a gas during the annealing process is made of a metal, and the plasma process included in the annealing process is performed by using a frequency of 60 MHz or more and 300 MHz or less.
12. The method of claim 11, wherein the annealing process is performed while a temperature of the gas shower head is set to exceed 80 degrees C.
13. The method of claim 9, wherein a plasma sheath voltage during the plasma process included in the annealing process is 30 eV or less.
14. The method of claim 1, wherein the depositing the fluidic oligomer and the performing the plasma process to hydrogen-terminate the fluidic oligomer are repeated a plurality of times.
15. The method of claim 1, wherein the depositing the fluidic oligomer, the performing the plasma process to hydrogen-terminate the fluidic oligomer, and the performing the annealing process to form the insulating film are repeated a plurality of times.
16. The method of claim 1, wherein the depositing the fluidic oligomer and the performing the plasma process to hydrogen-terminate the fluidic oligomer are performed in a same processing space.
17. The method of claim 1, wherein the performing the plasma process to hydrogen-terminate the fluidic oligomer and the performing the annealing process to form the insulating film are performed in different processing spaces.
18. The method of claim 1, wherein a precursor constituting the precursor gas is a silicon-containing precursor or a boron-containing precursor.
19. The method of claim 18, wherein the silicon-containing precursor is a Si-O bond-containing precursor.
20. The method of claim 19, wherein the Si-O bond-containing precursor is at least one selected from the group consisting of tetramethoxysilane, methyltrimethoxysilane, tetraethoxysilane, dimethyldimethoxysilane, triethoxysilane, trimethoxysilane, and trimethoxy disiloxane.
21. The method of claim 18, wherein the silicon-containing precursor is a Si-N bond-containing precursor.
22. The method of claim 21, wherein the Si-N bond-containing precursor is at least one selected from the group consisting of bis (tert-butylamino) silane, bis(tertbutylamino) methylsilane, bis(ethylmethylamino) silane, tridim-
ethylaminesilane, methyltridimethylaminosilane, and hex-
amethylcyclotrisilazane.

23. The method of claim 18, wherein the boron-contain-
ing precursor is at least one selected from the group con-
sisting of diborane, borazine, triethylborane, triethylamine-
borane, tri(dimethylamino) borane, tri(ethylmethylamino)
borane, and trimethylborazine.

24. The method of claim 18, wherein the fluidic oligomer
contains, as a basic structure, any of SiOH, SINH, SiCOH,
SiCNH, SICH, BNH, BCNH, SiBCNH, and SiBNH.

25. The method of claim 24, wherein the insulating film
contains any of $SiO_2$, SiN, SiCO, SiCN, SiC, BN, BCN,
SiBCN, and SiBN.

26. A substrate processing system comprising:
a plurality of processing apparatuses configured to pro-
cess a substrate;
a transfer mechanism configured to transfer the substrate
between the plurality of processing apparatuses; and
a controller,

14 wherein the controller controls the plurality of processing
apparatuses and the transfer mechanism to form an
insulating film by executing:
by any of the processing apparatuses, supplying a precur-
sor gas to the substrate to generate a fluidic oligomer by
plasma polymerization and depositing the fluidic oli-
gomer on the substrate;
by any of the processing apparatuses, performing a
plasma process on the substrate after the depositing the
fluidic oligomer, so that at least a part of the fluidic
oligomer is hydrogen- terminated while maintaining
fluidity of the fluidic oligomer; and
subsequently performing an annealing process, which
includes a plasma process, on the substrate to form the
insulating film,
wherein the depositing the fluidic oligomer and the per-
forming the plasma process to hydrogen-terminate the
fluidic oligomer are performed while a temperature of
the substrate is set to be 80 degrees C. or less.

* * * * *